(12) United States Patent
Broili et al.

(10) Patent No.: US 9,920,771 B2
(45) Date of Patent: Mar. 20, 2018

(54) INTEGRATED CROSSFLOW BLOWER MOTOR APPARATUS AND SYSTEM

(71) Applicant: Intel Corporation, Santa Clara, CA (US)

(72) Inventors: Ben M. Broili, Tacoma, WA (US); Tod A. Byquist, Federal Way, WA (US); Michael S. Brazel, Federal Way, WA (US); Joseph A. Cervantes, San Jose, CA (US)

(73) Assignee: INTEL CORPORATION, Santa Clara, CA (US)

(*) Notice: Subject to any disclaimer, the term of this patent is extended or adjusted under 35 U.S.C. 154(b) by 97 days.

(21) Appl. No.: 15/012,754

(22) Filed: Feb. 1, 2016

(65) Prior Publication Data

US 2016/0265552 A1 Sep. 15, 2016

Related U.S. Application Data

(62) Division of application No. 12/827,144, filed on Jun. 30, 2010, now Pat. No. 9,249,803.

(51) Int. Cl.
| | |
|---|---|
| H05K 7/20 | (2006.01) |
| F04D 29/58 | (2006.01) |
| F04D 17/04 | (2006.01) |
| F04D 25/06 | (2006.01) |
| F04D 29/056 | (2006.01) |
| F04D 29/28 | (2006.01) |
| F04D 29/42 | (2006.01) |

(52) U.S. Cl.
CPC .......... *F04D 29/584* (2013.01); *F04D 17/04* (2013.01); *F04D 25/06* (2013.01); *F04D 25/0606* (2013.01); *F04D 29/056* (2013.01); *F04D 29/282* (2013.01); *F04D 29/4226* (2013.01); *H05K 7/20136* (2013.01)

(58) Field of Classification Search
None
See application file for complete search history.

(56) References Cited

U.S. PATENT DOCUMENTS

| | | | | |
|---|---|---|---|---|
| 5,879,141 A | * | 3/1999 | Yokozawa ............ | F04D 25/064 310/62 |
| 6,194,798 B1 | * | 2/2001 | Lopatinsky .............. | H02K 7/14 310/62 |
| 6,309,190 B1 | * | 10/2001 | Chen ..................... | F04D 25/066 417/423.1 |
| 6,525,938 B1 | * | 2/2003 | Chen ..................... | F04D 25/066 310/63 |

(Continued)

OTHER PUBLICATIONS

Office Action received for U.S. Appl. No. 12/495,374, dated Dec. 30, 2016, 8 pages.

*Primary Examiner* — Courtney Smith

(57) ABSTRACT

Some embodiments of an apparatus and system are described for a crossflow blower motor. An apparatus may comprise one or more motors operative to control a crossflow blower. The one or more motors may comprise one or more stator assemblies having a stator coil and a bent stator. The one or more motors may be configured to control a crossflow blower arranged to generate a flow of air in a direction substantially perpendicular to an axis of rotation of the crossflow blower. Other embodiments are described.

16 Claims, 4 Drawing Sheets

(56) References Cited

U.S. PATENT DOCUMENTS

| | | | |
|---|---|---|---|
| 6,527,522 B2* | 3/2003 | Chen | F04D 25/066 |
| | | | 310/91 |
| 8,702,403 B2* | 4/2014 | Horng | F04D 17/04 |
| | | | 415/205 |
| 9,249,803 B2* | 2/2016 | Broili | F04D 17/04 |
| 2002/0090307 A1* | 7/2002 | Cheng | F04D 29/582 |
| | | | 417/423.1 |
| 2006/0002081 A1 | 1/2006 | Hongo et al. | |
| 2006/0078428 A1* | 4/2006 | Zheng | F04D 17/04 |
| | | | 415/206 |
| 2007/0053781 A1* | 3/2007 | Davis | A61M 1/101 |
| | | | 417/423.1 |
| 2009/0273258 A1* | 11/2009 | Aiello | H02K 1/185 |
| | | | 310/425 |
| 2010/0104455 A1* | 4/2010 | Tsai | H02K 3/522 |
| | | | 417/354 |
| 2010/0172095 A1* | 7/2010 | MacDonald | F04D 17/04 |
| | | | 361/695 |

* cited by examiner

INTEGRATED CROSSFLOW BLOWER MOTOR APPARATUS AND SYSTEM

CROSS-REFERENCE TO RELATED APPLICATIONS

This application is a divisional of, claims the benefit of and priority to previously filed U.S. patent application Ser. No. 12/827,144 filed Jun. 30, 2010, entitled "INTEGRATED CROSSFLOW BLOWER MOTOR APPARATUS AND SYSTEM", the subject matter of which is incorporated herein by reference in its entirety.

BACKGROUND

Modern computing systems generate heat during operation. The heat may affect certain platform components of a system, and is therefore generally required to be dissipated or removed from the system. Heat generated by the computing system may be limited or reduced using various thermal management techniques and/or heat dissipation techniques. For example, heat generated by a processor may be dissipated by a heat exchanger. Heat transfer through a heat exchanger may be enhanced by creating a flow of air using a fan or blower. Further, various platform-level cooling devices may be implemented in conjunction with the fan or blower to enhance heat dissipation, such as heat pipes, heat spreaders, heat sinks, vents, phase change materials or liquid-based coolants.

Traditional blowers used in portable computing systems generate a flow of air from an inlet parallel to the axis of rotation (e.g. the axial direction) to an outlet substantially perpendicular to the axis of rotation or from an inlet parallel to the axis of rotation to an outlet that is also parallel to the axis of rotation. Traditional fans, such as axial fans and centrifugal blowers, also include a large volume in the center of the impeller where a motor is located. These and other factors may be problematic in notebook computers, for example, because these traditional fans require inlet and/or outlet gaps above and/or below the fan housing and also require additional space to accommodate the motor. Because of the size constraints of notebook computers and other mobile computing devices, the cooling capacity of traditional systems is thermally limited by the size of fan and motor that can be accommodated inside a notebook computer enclosure while allowing sufficient space for inlet gaps and a motor above and/or below the fan housing. Furthermore, the form factor of notebook computers and other mobile computing devices continues to decrease in size, resulting in less available space for cooling components. Consequently, a need exists for improved cooling techniques mobile computing devices.

DETAILED DESCRIPTION

The embodiments are generally directed to techniques designed to improve cooling in mobile computing devices, such as notebook and ultrathin notebook computers. Various embodiments provide techniques that include a crossflow blower that creates a side-in, side-out airflow pattern within a mobile computing device enclosure. The creation of a side-in, side-out airflow pattern eliminates the need to allow for inlet and/or outlet gaps above and/or below traditional fan housings, which in turn allows for the creation of thinner notebook enclosures having fans with taller axial heights. For example, a fan having an increased rotor or axial height compared to a traditional cooling fan may be used in the same system if a side-in, side-out airflow pattern is utilized. The use of a taller fan allows for improved cooling capabilities, increased system performance and improved acoustics. Some embodiments also provide for an apparatus and system to control or drive a crossflow blower. For example, some embodiments may include one or more motors operative to control the crossflow blower, wherein the one or more motors include one or more stator assemblies having a stator coil and a bent stator. Other embodiments are described and claimed.

The arrangement of the one or more motors, the crossflow blower and other described components may be varied for any particular implementation or system. Furthermore, it should be understood that reference throughout to a mobile computing device or a notebook computer may include any type or form of mobile computing device. For example, the described embodiments may include a notebook, laptop, mini laptop, ultrathin notebook, netbook, tablet PC, PDA, mobile phone, smart phone or any other computing device in which cooling in a enclosure with limited space is desired. Other embodiments are described and claimed.

Embodiments may include one or more elements. An element may comprise any structure arranged to perform certain operations. Each element may be implemented as hardware, software, or any combination thereof, as desired for a given set of design parameters or performance constraints. Although embodiments may be described with particular elements in certain arrangements by way of example, embodiments may include other combinations of elements in alternate arrangements.

It is worthy to note that any reference to "one embodiment" or "an embodiment" means that a particular feature, structure, or characteristic described in connection with the embodiment is included in at least one embodiment. The appearances of the phrases "in one embodiment" and "in an embodiment" in various places in the specification are not necessarily all referring to the same embodiment.

Figure 1:
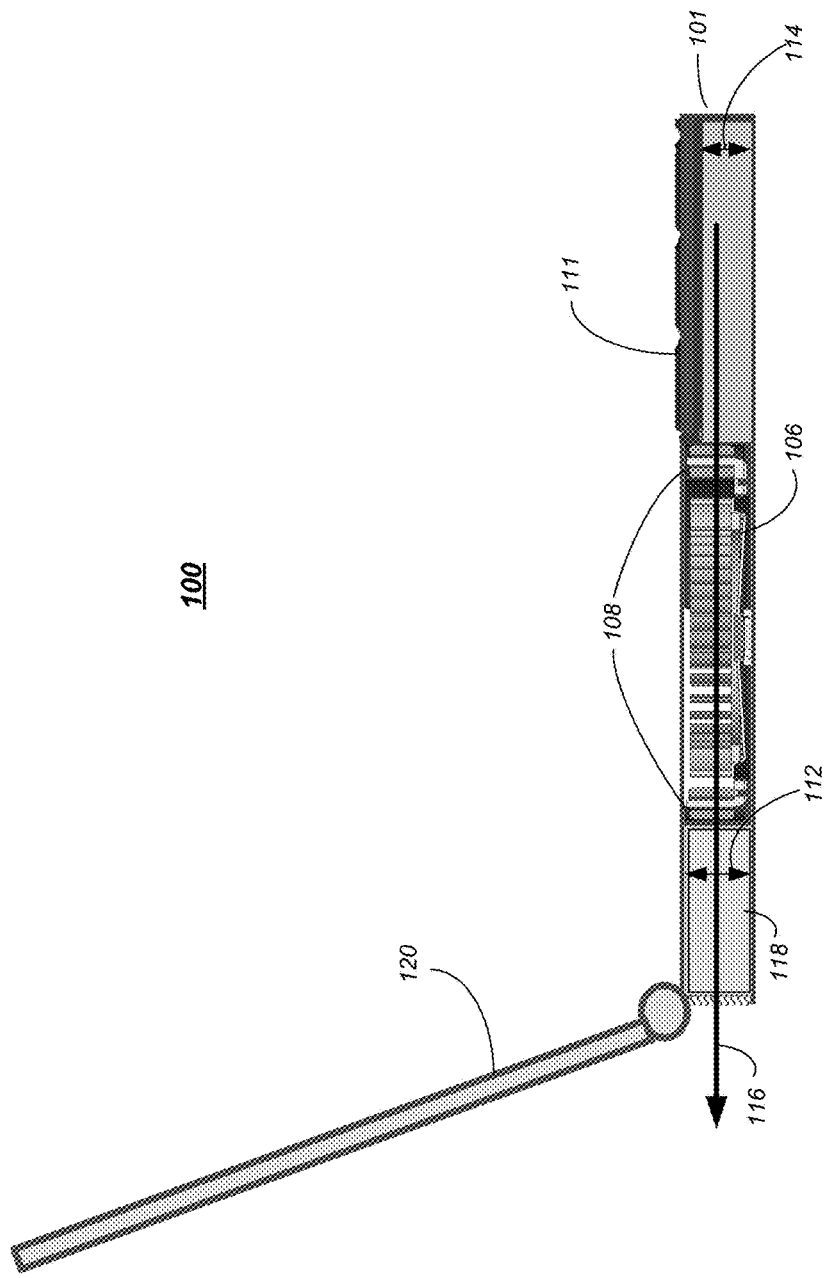
FIG. 1 illustrates one embodiment of a first apparatus or system.

FIG. 1 illustrates one embodiment of an apparatus. FIG. 1 illustrates a block diagram of an apparatus 100. Apparatus 100 may comprise a mobile computing device or notebook computer having an internal enclosure height of 8.0 mm or less in some embodiments. As shown in FIG. 1, apparatus 100 comprises multiple elements, such as enclosure 101, crossflow blower 106, motor(s) 108, keyboard 111, heat sink 118 and display 120. The embodiments, however, are not limited to the elements shown in this figure. In various embodiments, crossflow blower 106 may comprise a fan or blower arranged to create a side-in, side-out flow of air through the blower in a direction perpendicular to the axis of rotation of the blower. Other embodiments are described and claimed.

Motor(s) 108 may comprise any suitable electric motor capable of rotating crossflow blower 106 to create a flow of air in some embodiments. In various embodiments, motor(s) 108 may comprise an AC motor, brushed DC motor or brushless DC motor. For example, motor 108 may comprise a DC motor powered by an internal or external power source of apparatus 100. In some embodiments, motor 108 may comprise a tip-drive motor. The size, location within enclosure 101, and location with respect to crossflow blower 106 may be selected based on the size and performance constraints of a particular implementation and are discussed further with reference to FIGS. 2 and 3.

In various embodiments, the enclosure 101 may have any number of different internal heights, such as a first internal height 112 and a second internal height 114. As shown in FIG. 1, crossflow blower 106 and motor(s) 108 may be selected to have axial or vertical heights substantially similar to an internal height of enclosure 101 to maximize cooling capabilities. Other heights may be used and still fall within the described embodiments. Furthermore, it should be understood that adequate space between the crossflow blower 106 and the internal surfaces of the enclosure 101 should be provided such that the crossflow blower 106 does not contact the internal surfaces of the enclosure 101 when it is operated. In various embodiments the surface features of the areas surrounding the crossflow blower 106 may be configured to minimize leakage and minimize drag on the crossflow blower 106. For example, a side or wall of enclosure 101 may be used, in some embodiments, as part of a housing for the crossflow blower 106.

The motor(s) 108 may be positioned outside a radius of the crossflow blower 106, in some embodiments. In various embodiments, positioning the motors(s) outside a radius of the crossflow blower 106 may allow for the motor(s) 108 and the crossflow blower 106 to have a height that is approximately equal to an internal height of the enclosure 101. In this manner, the axial height of the crossflow blower 106 may be substantially maximized by the combination of crossflow blower 106 and motor(s) 108. Other embodiments are described and claimed.

Figure 2:
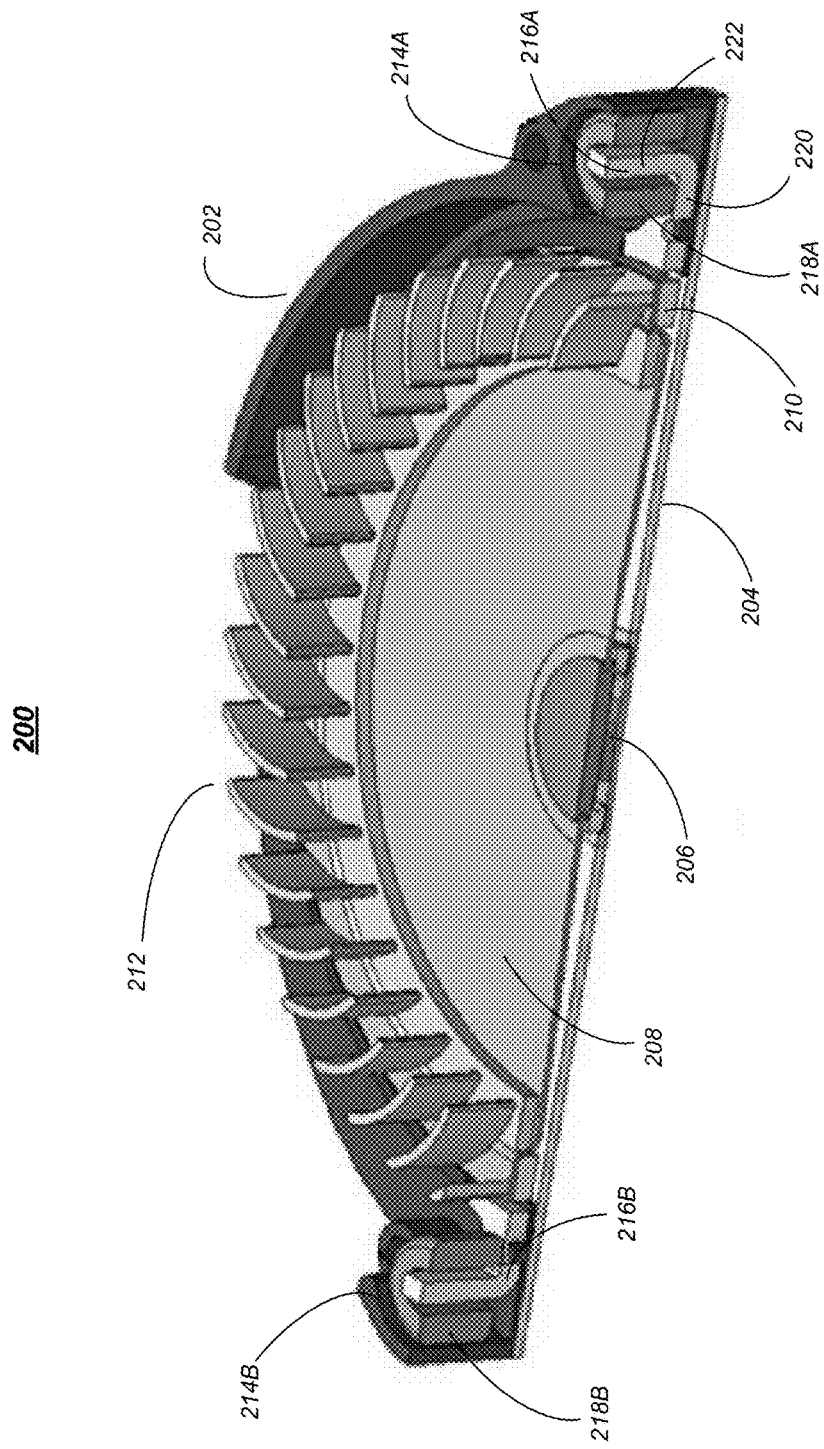
FIG. 2 illustrates one embodiment of a second apparatus or system.

FIG. 2 illustrates an apparatus 200. Apparatus 200 may comprise a crossflow blower assembly 200. Crossflow blower assembly 200 may be the same or similar to crossflow blower 106 and motor(s) 108 of FIG. 1 in some embodiments. In various embodiments, FIG. 2 illustrates a cross sectional view of a crossflow blower assembly 200 in order to illustrate certain details of the crossflow blower assembly 200. Other embodiments are described and claimed.

In some embodiments, crossflow blower assembly 200 may comprise a housing 202, a base plate 204, a bearing 206, an impeller 208, a magnet 210, impeller blades 212 and one or more stator assemblies 214A and 214B which may include stators 216A and 216B and a stator coils 218A and 218B. While a limited number and type of components are shown for purposes of illustration, it should be understood that any number, type or arrangement of components could be used and still fall within the described embodiments.

Housing 202 may comprise an enclosure arranged to mount or otherwise contain or stabilize a crossflow blower and one or more motors in some embodiments. In various embodiments, housing 202 may comprise a plastic or metal component configured to accommodate impeller 208 and stator assemblies 214A and 214B, for example. In some embodiments, the housing 202 may comprise a plastic component, such as an injection molded plastic component, that provides an inlet, outlet and flow management features for the crossflow blower assembly 200.

In various embodiments, housing 202 may further include base plate 204. Base plate 204 may comprise, for example, a metal base plate that is attached or coupled to housing 202. In some embodiments, base plate 204 is configured as a metal base plate to decrease the thickness of the base plate 204 and to decrease the overall height of crossflow blower assembly 200. For example, a metal base plate 204 may be desirable as it may retain better stiffness and rigidity required to provide adequate support for crossflow blower assembly 200 than a plastic base plate of the same thickness. In various embodiments, base plate 204 may comprise a plastic base plate that forms a contiguous intenerated structure along with housing 202, or is otherwise coupled or attached to housing 202. In some embodiments, a side, wall or other portion of a mobile computing device enclosure (not shown) may form the top or lid of the crossflow blower assembly, or an additional top plate may be configured as part of crossflow blower assembly 200. Other embodiments are described and claimed.

Bearing 206 may be configured to attach impeller 208 to base plate 204/housing 202 in some embodiments. For example, bearing 206 may comprise a device configured to allow constrained relative motion between two or more parts, typically rotation or linear movement. In some embodiments, for example, bearing 206 may allow for movement or rotation of impeller 208 around a fixed point of attachment on base plate 204.

In various embodiments, crossflow blower assembly 200 may include an impeller 208 with a plurality of impeller blades 212. Impeller 208 and impeller blades 212 may be configured to increase the pressure and/or flow of air in some embodiments. Impeller blades 212 may be any size, shape, number or configuration suitable for inducing the flow of air. In some embodiments, the impeller blades 212 may be spaced unevenly to improve the acoustic characteristics of crossflow blower assembly 200. In various embodiments, the number of blades may be selected to reduce resonant acoustic noise created by the crossflow blower assembly 200 in a predefined frequency range or feathering or notching of the impeller blades 212 may be utilized to reduce coherent noise production. Furthermore, passive or active noise cancellation components may optionally be included along with a crossflow blower assembly 200 to reduce resonant noise generated by the impeller 208 and impeller blades 212 in some embodiments.

Impeller 208 and impeller blades 212 may comprise separate components in some embodiments. For example, impeller blades 212 may comprise an injection-molded component that may be ultrasonically welded, heat-staked or otherwise coupled to impeller 208. Impeller 208, in various embodiments, may comprise a metal backing steel or plate that may be a stamped steel plate having a reinforced or joggled perimeter configured to add stiffness to the thin material as well as providing the backing steel for magnet 210. In some embodiments, impeller 208 may include a conical formation in the center of the steel plate to add stiffness to the thin metal part. Impeller 208 may be formed, stamped or arranged to provide an interference fit for bearing 206 and magnet 210 in some embodiments. Other embodiments are described and claimed.

Magnet 210 may comprise any suitable material or object that produces a magnetic field in some embodiments. For example, magnet 210 may comprise a permanent magnet or any other object made from a material that is magnetized and creates its own persistent magnetic field. In various embodiments, magnet 210 may be coupled or bonded to impeller 208 or co-molded to impeller 208. For example, magnet 210 may comprise a contiguous permanent magnet, such as a rubber magnet, running or arranged around a circumference of impeller 208. In various embodiments, magnet 210 may comprise a magnet having a thickness of approximately 1.0 mm.

In some embodiments, magnet 210 may include alternating magnetic poles. For example, magnet 210 may include alternating north (N) and (S) poles wherein the sizing and spacing of the alternating poles is selected to accommodate a particular implementation. In various embodiments, for example, the size and spacing of the alternating magnetic poles may be selected to correspond to at least one dimension of a stator 216A or 216B of stator assembly 214A or 214B. In some embodiments, each alternating magnetic pole may have a width that is substantially similar to a width of one or more of stators 216A or 216B.

Back plate 204 and/or impeller/backing steel 208 may be arranged, selected or configured to contain or isolate a magnetic field in some embodiments. For example, the Back plate 204 and/or impeller/backing steel 208 may comprise a steel material configured or selected to isolate one or more of the magnetic fields generated by magnet 210 or stator assemblies 214A or 214B. Other embodiments are described and claimed.

In some embodiments, stator assemblies 214A and 214B may comprise motors that are operative to control the crossflow blower assembly 200. In various embodiments, each stator assembly 214A and 214B includes a stator 216A or 216B and a stator coil 218A or 218B. For purposes of clarity and not limitation, stator assembly 214A is described herein. It should be understood that stator assemblies 214A and 214B may include the same or similar components, or the stator assemblies 214A and 214B may include different components selected to accommodate any particular implementation of a crossflow blower assembly 200.

In various embodiments, stator 216A may comprise a bent stator. For example, stator 216A may comprise a series of stamped ferromagnetic or electrical conductive laminates that are formed into approximately a ninety-degree bend. While various embodiments are described as including a ninety-degree or right-angle bend for the bent stator, it should be understood than any suitable bend or angle could be used and still fall within the described embodiments. Stator 216A may comprise, for example, a first portion 220 that is arranged to be substantially perpendicular to the axis of rotation of the crossflow blower and a second contiguous portion 222 that is arranged to be substantially parallel to the axis of rotation of the crossflow blower. In some embodiments, second portion 222 may extend vertically in the Z direction as shown in FIG. 2.

In some embodiments, stator 216A may comprise a stator having two or more portions, wherein one or more portions of the stator extend on a plane different than a X-Y plane that is substantially perpendicular to an axis of rotation of the crossflow blower. In various embodiments, the stator may comprise two or more portions of conductive material that are coupled together and wherein the stator coil 218A is arranged around the one or more portions of the stator 216A that extend on a plane different than the X-Y plane (e.g. portion 222, for example). For example, two or more portions of material may be screwed, welded, coupled or otherwise fastened together to form stator 216A. In some embodiments, the one or more portions of the stator 216A that extend on a plane different than the X-Y plane are configured to extend on an angle away from the X-Y plane in a direction of the axis of rotation of the crossflow blower. While shown as a ninety-degree angle in some embodiments, it should be understood than any angle away from the X-Y plane could be used and still fall within the described embodiments. Other embodiments are described and claimed.

The stator assembly 214A may comprise an insulation layer between the bent stator 216A and the stator coil 218A in some embodiments. The insulation layer may comprise a material selected and arranged to prevent the stator coil 218A from creating an electrical short in some embodiments.

In some embodiments, the stator coil 218A may comprise one or more magnetic coils wound on or around a vertical or second portion 222 of the bent stator 216A. In various embodiments, the stator coils 218A are arranged around the second portion 222 of the bent stator to generate a magnetic field in a direction substantially parallel to the axis of rotation of the crossflow blower. For example, the magnet field generated by the stator assembly 214A may extend on a plane parallel to the second portion 222 of stator 218A. In some embodiments, the first portion 220 of the bent stator 218A is arranged to direct the magnetic field in a direction substantially perpendicular to the axis of rotation of the crossflow blower. For example, the first portion 220 of the bent stator 218A may direct or re-direct the magnetic field toward magnet 210 and impeller 208. Other embodiments are described and claimed.

In various embodiments, placing the stator coils 218A on the vertical or angled portion (e.g. second portion 222) of the bent stator 216A may allow for a larger coil volume than would otherwise be possible if the stator 216A were straight. For example, if the crossflow blower assembly 200 is configured to fit within a 6.0 mm height envelope, and a straight stator is used, the maximum thickness of the stator coils would be limited by the height envelope of 6.0 mm. By way of contrast, by using a bent stator 218A, the thickness or size of the stator coil 218A can be expanded (e.g. in the X-Y direction) to accommodate a larger magnetic coil volume. In various embodiments, the stator coil 218A may have a first dimension in direction substantially parallel to an axis of rotation of the impeller (e.g. the Z direction) and a second dimension in a direction substantially perpendicular to an axis of rotation of the impeller (e.g. the X-Y directions) and, in some embodiments, the second dimension may be larger than the first dimension. Other embodiments are described and claimed.

The motors/stator assemblies 214A and 214B may comprise tip-drive motors in some embodiments. A tip-drive motor may comprise a magnetically tip-driven motor arranged such that the motor hub does not block or substantially does not block the primary airflow path for crossflow blower assembly 200. In various embodiments, the one or more motors may comprise a two-slot single-phase direct current (DC) brushless motor or a three-slot three-phase DC brushless motor.

In some embodiments, the placement of stator assemblies 214A and 214B at, near or outside the outer radius of the impeller 208 may allow for the impeller 208 to be spun from near its perimeter rather than from a center point as in traditional fans. In various embodiments, this configuration may allow for a more favorable positioning of the motors such that interference with airflow is reduced compared to central axially driving rotors. In some embodiments, the one or more motors may comprise two motors arranged on opposing sides of impeller 208 of the crossflow blower assembly 200 approximately one hundred and eighty degrees apart, as shown in FIG. 2 and further described in FIG. 3 below. Other embodiments are described and claimed.

Figure 3:
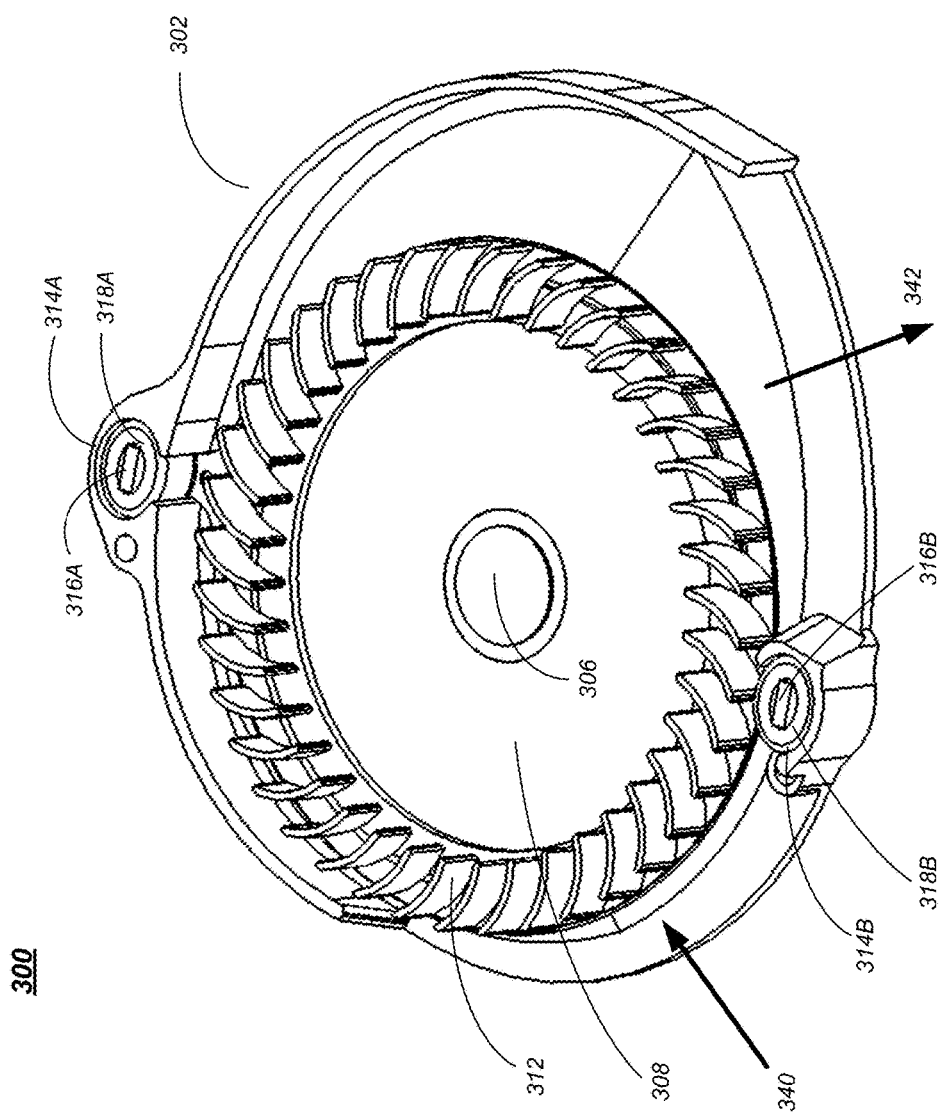
FIG. 3 illustrates one embodiment of a third apparatus or system.

FIG. 3 illustrates one embodiment of an apparatus 300. Apparatus 300 may comprise, for example, a crossflow blower assembly 300 which may be the same or similar to crossflow blower assembly 200 of FIG. 2. For purposes of clarity, like components are numbered similarly throughout. Crossflow blower assembly 300 may include a plurality of components, including housing 302, bearing 306, impeller 308, impeller blades 312 and stator assemblies 314A and 314B which may include stators 316A and 316B and stator coils 318A and 318B. While a limited number and arrangement of components are shown for purposes of illustration, it should be understood that any number, type or arrangement of components could be used and still fall within the described embodiments.

Crossflow blower assembly 300 may include a housing 302 having an inlet 340 and an outlet 342. In some embodiments, the inlet 340 may be larger than the outlet 342, the inlet 340 and outlet 342 may be substantially the same size, or the inlet 340 may be smaller than the outlet 342. In various embodiments, the inlet 340 may include rounded corners to enhance the airflow and pressure created by crossflow blower assembly 300. The precise arrangement of the inlet 340 and outlet 342 may be selected based on the desired pressure and flow for a particular implementation of crossflow blower assembly 300. Other embodiments are described and claimed.

In various embodiments, air may enter or be drawn in through inlet 340 and may exit or be forced out through outlet 342. The positioning of inlet 340 and outlet 342 and the direction of airflows may be different than that shown in FIG. 3 and still fall within the described embodiments.

Motors/stator assemblies 314A and 314B may be contained or mounted within housing 302 in some embodiments. In some embodiments, motors/stator assemblies 314A and 314B may be the same or similar those described above with reference to FIG. 2. In various embodiments, one or more of motors/stator assemblies 314A and 314B may be positioned in a predetermined recirculation zone of the crossflow blower assembly 300. For example, motors/stator assembly 314B may be placed at a position within housing 302 that has been determined to be a position where a vortex is created when air is flowing through the housing 302. By placing the motors/stator assemblies 314B at this position, the amount that the motor interferes with the airflow may be minimized and the motor may help to anchor or hold the vortex in place to increase performance of the crossflow blower assembly While a limited number, type and arrangement of crossflow blower assemblies and motors are shown for purposes of illustration, it should be understood than any number of blowers and/or motors could be used and still fall within the described embodiments. The above-described embodiments may be used to improve airflow in mobile computing devices, ultrathin notebooks or other devices having internal heights of 8.0 mm or less. In some embodiments, an internal height of 8.0 mm may correspond to a notebook having an exterior thickness of 0.5-0.8 inches, for example. In various embodiments, the tip-drive motors and crossflow blower assemblies described herein may be configured to fit within a 6.0 mm enclosure. Other embodiments are described and claimed.

Figure 4:
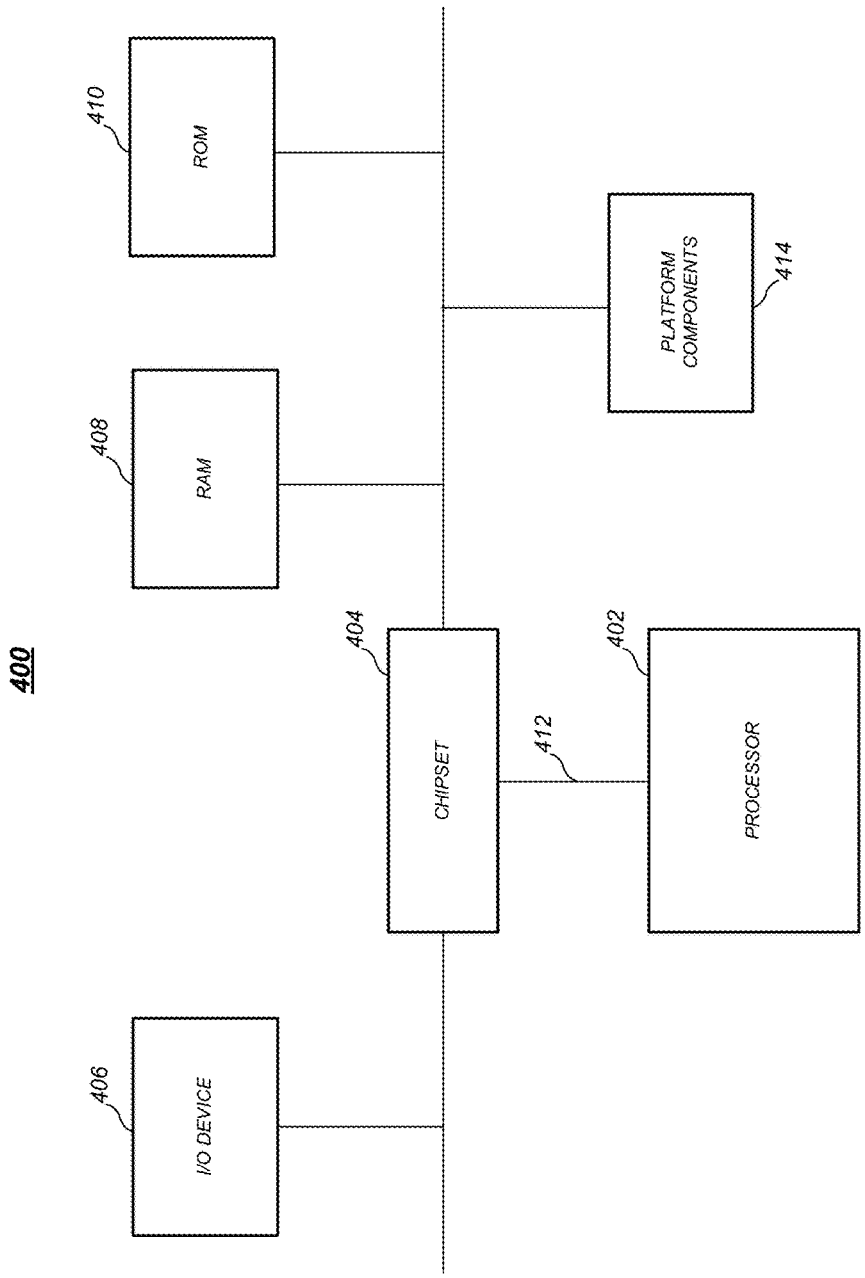
FIG. 4 illustrates one embodiment of a fourth apparatus or system.

FIG. 4 is a diagram of an exemplary system embodiment. In particular, FIG. 4 is a diagram showing a system 400, which may include various elements. For instance, FIG. 4 shows that system 400 may include a processor 402, a chipset 404, an input/output (I/O) device 406, a random access memory (RAM) (such as dynamic RAM (DRAM)) 408, and a read only memory (ROM) 410, and various platform components 414 (e.g., a fan, a crossflow blower, a heat sink, DTM system, cooling system, housing, vents, and so forth). These elements may be implemented in hardware, software, firmware, or any combination thereof. The embodiments, however, are not limited to these elements.

In particular, the platform components 414 may include a cooling system implementing various crossflow blower and motor techniques. The cooling system may be sized for the system 400, and may include any cooling elements designed to perform heat dissipation, such as heat pipes, heat links, heat transfers, heat spreaders, vents, fans, blowers, crossflow blowers and liquid-based coolants.

As shown in FIG. 4, I/O device 406, RAM 408, and ROM 410 are coupled to processor 402 by way of chipset 404. Chipset 404 may be coupled to processor 402 by a bus 412. Accordingly, bus 412 may include multiple lines.

Processor 402 may be a central processing unit comprising one or more processor cores and may include any number of processors having any number of processor cores. The processor 402 may include any type of processing unit, such as, for example, CPU, multi-processing unit, a reduced instruction set computer (RISC), a processor that have a pipeline, a complex instruction set computer (CISC), digital signal processor (DSP), and so forth.

Although not shown, the system 400 may include various interface circuits, such as an Ethernet interface and/or a Universal Serial Bus (USB) interface, and/or the like. In some exemplary embodiments, the I/O device 406 may comprise one or more input devices connected to interface circuits for entering data and commands into the system 400. For example, the input devices may include a keyboard, mouse, touch screen, track pad, track ball, isopoint, a voice recognition system, and/or the like. Similarly, the I/O device 406 may comprise one or more output devices connected to the interface circuits for outputting information to an operator. For example, the output devices may include one or more displays, printers, speakers, and/or other output devices, if desired. For example, one of the output devices may be a display. The display may be a cathode ray tube (CRTs), liquid crystal displays (LCDs), or any other type of display.

The system 400 may also have a wired or wireless network interface to exchange data with other devices via a connection to a network. The network connection may be any type of network connection, such as an Ethernet connection, digital subscriber line (DSL), telephone line, coaxial cable, etc. The network may be any type of network, such as the Internet, a telephone network, a cable network, a wireless network, a packet-switched network, a circuit-switched network, and/or the like.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a machine-readable or computer-readable medium or article which may store an instruction, a set of instructions or computer executable code that, if executed by a machine or processor, may cause the machine or processor to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. In various embodiments, the medium may comprise a non-transitory medium. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter that lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus, comprising: a crossflow blower arranged to generate incoming and exhaust flows of air on a X-Y plane that is substantially perpendicular to an axis of rotation of the crossflow blower; and one or more motors operative to control the crossflow blower, the one or more motors comprising one or more stator assemblies having a stator coil and a stator having two or more portions, wherein one or more of the two or more portions of the stator extend on a plane different than the X-Y plane and the stator coil is arranged to encircle the one or more of the two or more portions of the stator that extend on the plane different than the X-Y plane such that the one or more of the two or more portions of the stator that extend on the plane different than the X-Y plane are arranged inside a portion of the stator coil, wherein the two or more portions of the stator include conductive materials that are coupled together and wherein the stator coil is arranged around the one or more of the two or more portions of the stator that extend on the plane different than the X-Y plane.

2. The apparatus of claim 1, wherein the one or more of the two or more portions of the stator that extend on a plane different than the X-Y plane are configured to extend on an angle away from the X-Y plane in a direction of the axis of rotation of the crossflow blower.

3. The apparatus of claim 1, comprising:
a housing;
an impeller having one or more impeller blades;
one or more bearings to couple the impeller to the housing; and
one or more magnetic materials having alternating magnetic poles coupled to the impeller.

4. The apparatus of claim 3, comprising:
an integrated metal back plate arranged as a body of the impeller, wherein the one or more impeller blades are coupled to the metal back plate; and
a permanent magnet coupled to the metal back plate and arranged separately from the one or more magnetic materials, wherein the metal back plate is arranged to substantially contain a magnet field.

5. The apparatus of claim 1, wherein the one or more motors are positioned outside an outer perimeter of one or more blades of an impeller of the crossflow blower.

6. A system, comprising: electronics for a mobile computing device; a crossflow blower arranged to generate one or more flows of air on a X-Y plane that is substantially perpendicular to an axis of rotation of the crossflow blower; and one or more motors operative to control the crossflow blower, the one or more motors comprising one or more stator assemblies having a stator coil and a stator having two or more portions, wherein one or more of the two or more portions of the stator extend on a plane different than the X-Y plane, and the one or more of the two or more portions of the stator that extend on the plane different than the X-Y plane are arranged to support the stator coil such that the stator coil encircles the one or more of the two or more portions of the stator that extend on the plane different than the X-Y plane and the one or more of the two or more portions of the stator that extend on the plane different than the X-Y plane are arranged inside a portion of the stator coil, wherein the two or more portions of the stator include conductive materials that are coupled together and wherein the one or more of the two or more portions of the stator that extend on the plane different than the X-Y plane are configured to extend on an angle away from the X-Y plane in a direction of the axis of rotation of the crossflow blower.

7. The system of claim 6, the crossflow blower comprising an impeller having a metal back plate, one or more impeller blades and a magnet coupled to the metal back plate, the crossflow blower arranged to generate incoming and exhaust flows of air on the X-Y plane.

8. The system of claim 7, wherein the magnet comprises a permanent magnet arranged along a circumference of the impeller, the magnet have alternating magnetic poles.

9. The system of claim 8, wherein the one or more stator assemblies generate one or more magnetic fields in the X-Y plane.

10. The system of claim 7, wherein the metal back plate comprises a stamped steel plate having a reinforced perimeter and a conical formation in the center of the steel plate, the stamped steep plate comprising, wherein impeller blades are ultrasonically welded or heat-seated to the stamped steel plate.

11. The system of claim 6, wherein the stator comprises one or more ferromagnetic or electrically conductive laminates that are formed or coupled into approximately a ninety-degree bend.

12. The system of claim 6, wherein the stator assembly comprises an insulation layer between the stator and the stator coil and wherein the stator coil comprises one or more magnetic coils wound on the one or more of the two or more portions of the stator that extend on a plane different than the X-Y plane.

13. A method comprising: sending a control signal to include an indication to activate one or more motors, the one or more motors operative to control a crossflow blower; and generate, at the crossflow blower, one or more flows of air on a X-Y plane that is substantially perpendicular to an axis of rotation of the crossflow blower, the one or more motors comprising one or more stator assemblies having a stator coil and a stator having two or more portions, wherein one or more of the two or more portions of the stator extend on a plane different than the X-Y plane, and the one or more of the two or more portions of the stator that extend on the plane different than the X-Y plane are arranged to support the stator coil such that the stator coil encircles the one or more of the two or more portions of the stator that extend on the plane different than the X-Y plane and the one or more of the two or more portions of the stator that extend on the plane different than the X-Y plane are arranged inside a portion of the stator coil, wherein the two or more portions of the stator include conductive materials that are coupled together and wherein the one or more of the two or more portions of the stator that extend on the plane different than the X-Y plane are configured to extend on an angle away from the X-Y plane in a direction of the axis of rotation of the crossflow blower.

14. The method of claim 13, comprising directing the one or more flows of at a heat generating component of a computing device.

15. The method of claim 13, wherein the stator comprises two or more portions of conductive material that are coupled together and wherein the stator coil is arranged around the one or more of the two or more portions of the stator that extend on a plane different than the X-Y plane.

16. The method of claim 13, the crossflow blower comprising an impeller having a metal back plate, one or more impeller blades and a magnet coupled to the metal back plate, the crossflow blower arranged to generate incoming and exhaust flows of air on the X-Y plane, wherein the magnet comprises a permanent magnet arranged along a circumference of the impeller, the magnet have alternating magnetic poles.

* * * * *